(12) United States Patent
Diao et al.

(10) Patent No.: US 7,738,287 B2
(45) Date of Patent: Jun. 15, 2010

(54) METHOD AND SYSTEM FOR PROVIDING FIELD BIASED MAGNETIC MEMORY DEVICES

(75) Inventors: Zhitao Diao, Fremont, CA (US); Lien-Chang Wang, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 59 days.

(21) Appl. No.: 11/692,090

(22) Filed: Mar. 27, 2007

(65) Prior Publication Data

US 2008/0273380 A1 Nov. 6, 2008

(51) Int. Cl.
*G11C 11/00* (2006.01)
(52) U.S. Cl. .................................. 365/158; 365/173
(58) Field of Classification Search .................. 365/158, 365/173
See application file for complete search history.

(56) References Cited

U.S. PATENT DOCUMENTS

| 5,659,499 | A | 8/1997 | Chen et al. |
| 5,940,319 | A | 8/1999 | Durlam et al. |
| 6,153,443 | A | 11/2000 | Durlam et al. |
| 6,211,090 | B1 | 4/2001 | Durlam et al. |
| 6,335,890 | B1 | 1/2002 | Reohr et al. |
| 6,430,084 | B1 | 8/2002 | Rizzo et al. |
| 6,740,947 | B1 | 5/2004 | Bhattacharyya et al. |
| 6,909,630 | B2 | 6/2005 | Tsang |
| 7,230,845 | B1 * | 6/2007 | Wang et al. ........... 365/173 |
| 2002/0034117 | A1 | 3/2002 | Okazawa |
| 2002/0127743 | A1 | 9/2002 | Nickel et al. |
| 2004/0008536 | A1 | 1/2004 | Garni et al. |
| 2006/0028862 | A1 | 2/2006 | Min et al. |
| 2006/0077707 | A1 | 4/2006 | Deak |
| 2006/0198185 | A1 | 9/2006 | Hiebert et al. |
| 2006/0291107 | A1 * | 12/2006 | Sbiaa et al. ........... 360/324.12 |

OTHER PUBLICATIONS

PCT International Search Report and Written Opinion of the International Searching Authority, issued Aug. 6, 2008, application No. PCT/US08/58231.

* cited by examiner

*Primary Examiner*—Hoai V Ho
(74) *Attorney, Agent, or Firm*—Covergent Law Group LLP

(57) ABSTRACT

A method and system for providing a magnetic memory is disclosed. The method and system include providing a plurality of magnetic storage cells in an array, a plurality of bit lines, and at least one bias structure. Each of the plurality of magnetic storage cells includes at least one magnetic element having an easy axis and being programmable by at least one write current driven through the magnetic element. The plurality of bit lines corresponds to the plurality of magnetic storage cells. The at least one bias structure is magnetically coupled with the at least one magnetic element in each of the plurality of magnetic storage cells. The at least one bias structure provides a bias field in a direction greater than zero degrees and less than one hundred eighty degrees from the easy axis.

30 Claims, 9 Drawing Sheets

METHOD AND SYSTEM FOR PROVIDING FIELD BIASED MAGNETIC MEMORY DEVICES

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. Typically, one or more reference or pinned layers has a fixed magnetization, while a free layer has a magnetization that can be changed. Binary coded information, "1" or "0", typically corresponds to the magnetizations of the free and reference layers being parallel or anti-parallel, respectively. Information is written by setting the magnetization direction(s) of the free layer(s) in a specified cell. This is typically accomplished either using a magnetic field generated by supplying a current to a write line disposed in a cross stripe shape, or directly using a current induced switching scheme utilizing the spin transfer effect.

FIGS. 1 and 2 depict portions of conventional MRAMs 10 and 30, respectively. Referring to FIG. 1, the conventional magnetic memory 10 includes magnetic storage elements, such as the magnetic storage element 20. The magnetic storage elements 20 are switched using an external magnetic field (field-based switching). The conventional MRAM 10 also includes a write word line 12, interlayer dielectric layers 14, metal 16, bypass 18, via 24, and bit line 26. Typically, the bit lines 26 and write word lines 12 run in perpendicular directions, with the magnetic storage elements 20 residing at the crossings. The magnetic storage element 20 is coupled to the underlying metal plug 16 through the bypass 18 and is insulated from the write word line 12. The magnetic storage element 20 is also coupled to the bit line 26 above through the via 24.

In the conventional MRAM 10, a magnetic field is used to switch the state of the magnetic storage element 20. In particular, currents may be driven through the bit line 26 and the write word line 12. However, one of ordinary skill in the art will recognize that the currents required to write to the magnetic storage element 20 do not scale down as the size of the magnetic cell 11 decreases. Because of this, a relatively high current may be needed to generate a magnetic field sufficient to switch the state of the magnetic storage element 20. Consequently, power consumption of the MRAM 10 increases and more reliability issues may be encountered due to the higher current carried by the bit line 26 and word line 12. The conventional field-based MRAM 10 may thus be unsuitable for use at higher densities.

In contrast, the conventional MRAM 30 of FIG. 2 may be written by driving a current through the magnetic storage element 38 (current-based switching). Generally, the MRAM 30 is written using the spin transfer effect. The conventional MRAM 30 thus includes magnetic storage elements, such as the magnetic storage element 38, that utilize current-based switching. For example, the magnetic storage element 38 might include a magnetic tunneling junction. In addition, the lateral dimensions of the magnetic storage element 38 may be small, for example in the range of a few hundred nanometers or less, in order to facilitate current-based switching through the spin transfer effect. The conventional MRAM 30 also includes a metal plug 32, interlayer dielectric layers 34 and 36, via 40, bit line 42, and a word line (not shown). Typically, the bit lines 42 and word lines run in perpendicular directions, with the magnetic storage elements 38 residing at the cross- ings. The magnetic storage element 38 is coupled to the underlying selection transistor (not shown) via a metal plug 32 and to the bit line 42 above through the via 40. Typically, a memory cell 11 or 31 includes the magnetic storage element 20 or 38, respectively, as well as a selection transistor (not shown). In addition, although depicted as being connected to the bit line 42 through the via 40, in some conventional magnetic memories, the magnetic storage element 38 may be directly connected to the bit line 42.

In the conventional MRAM 30, the current driven through the magnetic storage element 38 induces switching of the magnetization of the free layers of the magnetic storage elements 38. This current required to switch the free, or recording, layers (switching current) decreases as the MRAM 30 density grows, scaling down in a manner comparable to the semiconductor or CMOS technology evolution. The current density required to switch the magnetic element (switching current density), $J_c$, achievable is on the order of $10^6$ A/cm$^2$. Further, isolation transistors (not shown) used in conventional MRAM 30 have dimension that are proportional to the saturation current and thus scale with the switching current. This low switching current density for the MRAM 30 allows spin transfer switching to be useful in high density MRAM. In particular, the low switching current density may allow for lower power consumption and smaller isolation transistors than the conventional MRAM 10. Currently, the switching current corresponding to the low switching current density may be as small as 0.1 mA. This current is significantly smaller than the switching current used in generating the magnetic field for the conventional field-switched MRAM 10. Power consumption may thus be significantly reduced. Further, because smaller isolation transistors may be used, the size of the magnetic storage cell 31 may be reduced.

Although the lower switching current density is desirable, one of ordinary skill in the art will recognize that there are still issues with using the MRAM 30 at higher densities. In particular, size related issues and the initial conditions of the magnetic storage element 38 may adversely affect performance of the MRAM 30. For example, changes in initial magnetization or magnetic distribution of the free layer may radically affect the current-based switching of the free layer.

The affect of the initial conditions may be understood using current spin transfer models. According to a prevalent spin transfer model, at nanosecond switching regime the switching time, $\tau$, for the magnetic cell 31 may be expressed as:

$$\tau = \frac{2}{\alpha \gamma M_s} \frac{I_{c0}}{I_{pulse} - I_{c0}} \ln \frac{\pi}{2\theta_0} \quad (1)$$

where $\alpha$, $\gamma$ and $M_s$, are the phenomenological Gilbert damping, the gyromagnetic ratio and saturation magnetization of the free layer, respectively. In spin transfer switching, a precession mode of initial angle $\theta_0$ id pumped until the amplitude reaches $\pi/2$ with an overdrive of $I_{pulse}/I_{c0}-1$. In principle, the switching is very sensitive to the initial condition $\theta_0$, which is distinct from the long pulse regime. Due to temperature fluctuations of the magnetization around the magnetization's equilibrium position, the divergent slow-down does not occur in such spin transfer switching. Thermal fluctuations cause the excursion of the magnetization from the easy axis by an average amount of $\sqrt{kT/H_K M_s V}$, which generally aids the spin transfer based switching. However, thermal fluctuations may also cause a large distribution in switching time or current, which is undesirable for device applications.

In addition, depending upon the initial state of the magnetic storage element 38, the distribution in switching current across the MRAM 30 may change. Micromagnetic modeling indicates that the actual magnetic moment, for instance, of a standard elliptical magnetic storage element is not uniform. Instead, the magnetic moment has some distribution at the corners subject to the external driving force, such as an Oster field, due to existence of the writing current. For example, the moment distribution of particular magnetic storage elements 38 may include a C-shape state. In such a state there is no Oster field effect at the center portion of the magnetic storage element and the moment is aligned uniformly. However, at the corner the field effect is significant and tends to re-align the moment of the magnetic storage element 38 toward the C-state. This state thus stabilizes, or tends to lock, the moment from switching. Magnetic storage elements 38 in this state may require a higher current to switch, resulting in non-uniform switching. As a result, a wider distribution of current may exist. In addition, these two states may randomly occur in the switching process, depending upon factors such as previous switching processes and history of the magnetic storage element 38. It is, therefore, generally undesirable to commence a magnetization switching process with "C" state because of the potential for the formation of vortices during the switching. Additional energy is generally required to overcome a vortex for a full switching, giving rise to larger switching current with an increased distribution.

At higher densities, the conventional MRAM 30 may also suffer from size-related issues due to edge effects in the magnetic storage element 38. In order for the magnetic storage cell 31 of the conventional MRAM 30 to be written at small current, it is desirable to shrink the size of the magnetic storage cells 31. Size-related issues may occur for such smaller magnetic storage cells 31. As the size of the magnetic storage cells 31 decreases, the magnetic storage element 38 is also typically reduced in size. This reduction in size typically results in non-uniform and uncontrollable edge-fields for the magnetic storage element 38 that are produced by shape-anisotropy. The edge fields result in a large degree of randomly oriented magnetization vectors that form at the edge of the magnetic storage element 38. These magnetization vectors tend to curl back towards the magnetization vector of the body of the magnetic storage element 38. This tends to reduce the energy of the magnetic storage element 38. Such edge effects are also associated with uncompensated magnetic poles that form at the edge of the magnetic storage element 38. Moreover, as the size of the magnetic storage element 38 is decreased, the edge fields become at least as significant as the magnetization of the body of the magnetic storage element 38. Consequently, these edge effects may adversely affect on data write performance. Any irregularities of these shapes, defects at the edge produced during the formation, or uncompensated poles of variable strength, may result in coercivity fluctuation distributed throughout the MRAM 30 array. Thus, the edge effects and non-uniform array coercivity that become noticeable at smaller sizes adversely affect the conventional MRAM 30.

Consequently, although the MRAM 30 has a possibility of being used in higher density memories, issues related to initial conditions and the size of the magnetic storage element 38 persist. These issues adversely affect performance of the MRAM 30, for example resulting in a wider current distribution and a higher switching current. Accordingly, what is needed is a method and system that may improve performance of the current-based switching MRAM 30. The method and system addresses such a need.

BRIEF SUMMARY OF THE INVENTION

A method and system for providing a magnetic memory are disclosed. The method and system include providing a plurality of magnetic storage cells in an array, a plurality of bit lines, and at least one bias structure. Each of the plurality of magnetic storage cells includes at least one magnetic element having an easy axis and being programmable by at least one write current driven through the magnetic element. The plurality of bit lines corresponds to the plurality of magnetic storage cells. The at least one bias structure is magnetically coupled with the at least one magnetic element in each of the plurality of magnetic storage cells. The at least one bias structure provides a bias field in a direction greater than zero degrees and less than one hundred eighty degrees from the easy axis According to the method and system disclosed herein, a magnetic memory having improved performance may be achieved.

DETAILED DESCRIPTION OF THE INVENTION

Figure 1:
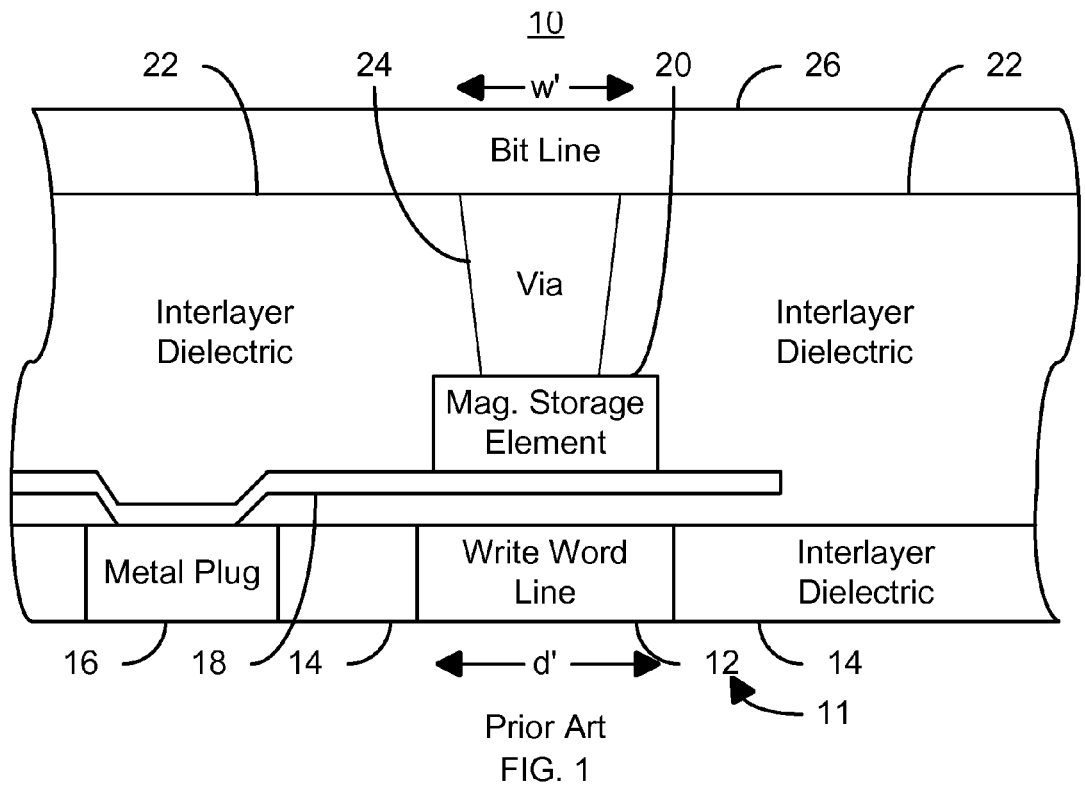
FIG. 1 is a diagram of a conventional MRAM using field-based switching.
Figure 2:
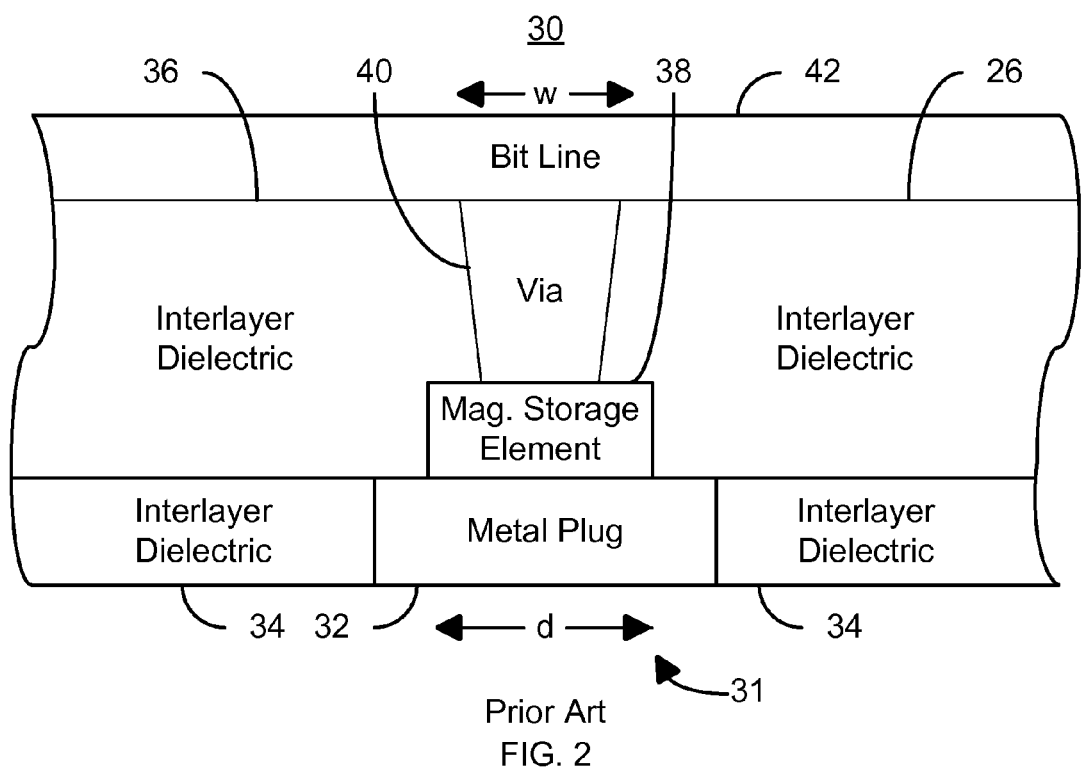
FIG. 2 is a diagram of a conventional MRAM using current-based switching.

The method and system relate to magnetic memories. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic memory are disclosed. The method and system include providing a plurality of magnetic storage cells in an array, a plurality of bit lines, and at least one bias structure. Each of the plurality of magnetic storage cells includes at least one magnetic element having an easy axis and being programmable by at least one write current driven through the magnetic element. The plurality of bit lines corresponds to the plurality of magnetic storage cells. The at least one bias structure is magnetically coupled with the at least one magnetic element in each of the plurality of magnetic storage cells. The at least one bias structure provides a bias field in a direction greater than zero degrees and less than one hundred eighty degrees from the easy axis The method and system will be described in terms of particular methods and particular components in the magnetic memory. One of ordinary skill in the art will recognize that magnetic memories having other and/or additional components not inconsistent with the method and system may be used. The method and system are also described in the context of particular magnetic elements. However, one of ordinary skill in the art will realize that other magnetic storage elements employing current-based switching that are not inconsistent with the method and system may be used. One of ordinary skill in the art will readily recognize that for ease of explanation some steps in the method may have been omitted and/or combined with other steps. Furthermore, the methods system may be used in conjunction with additional and/or different steps not inconsistent with the method and system. The method and system are also described in the context of a particular architecture. However, one of ordinary skill in the art will recognize that another architecture not inconsistent with the method and system may be utilized. The method and system are also described in the context of a single magnetic storage element and/or a single storage cell. However, one of ordinary skill in the art will readily recognize that the method and system apply to memories having multiple magnetic storage elements and multiple magnetic storage cells that may be fabricated together. The method and system are also described in the context of current understanding of the spin transfer effect and other phenomenon. However, one of ordinary skill in the art will recognize that the method and system are not dependent upon this understanding. The method and system are also described in terms of simple layers, such as a simple (single layer) free layer, a simple pinned layer, and a simple antiferromagnetic layer. However, one of ordinary skill in the art will recognize that at least some of the layers could include multiple layers for example synthetic free or pinned layers, multilayer free or pinned layers, and/or multilayer antiferromagnetic layers.

Figure 3:
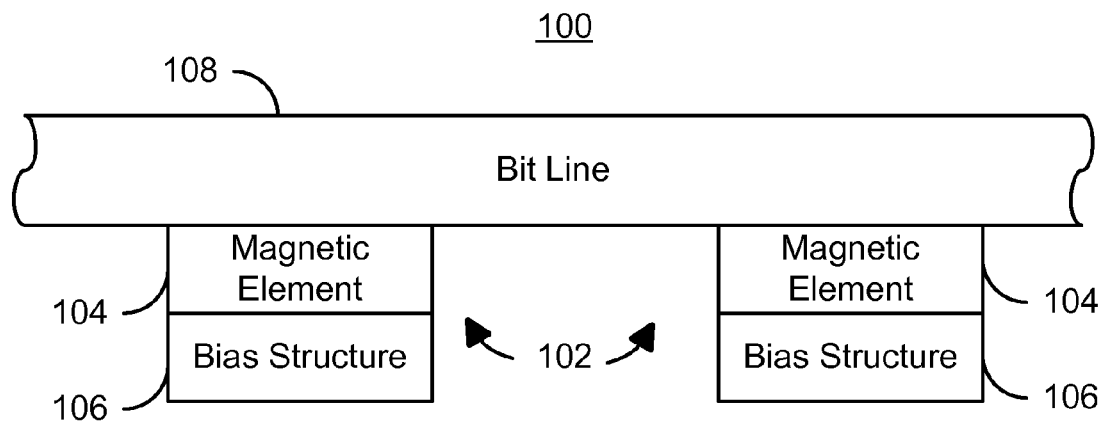
FIG. 3 is a diagram depicting an exemplary embodiment of a portion of a field-biased magnetic memory.
Figure 4:
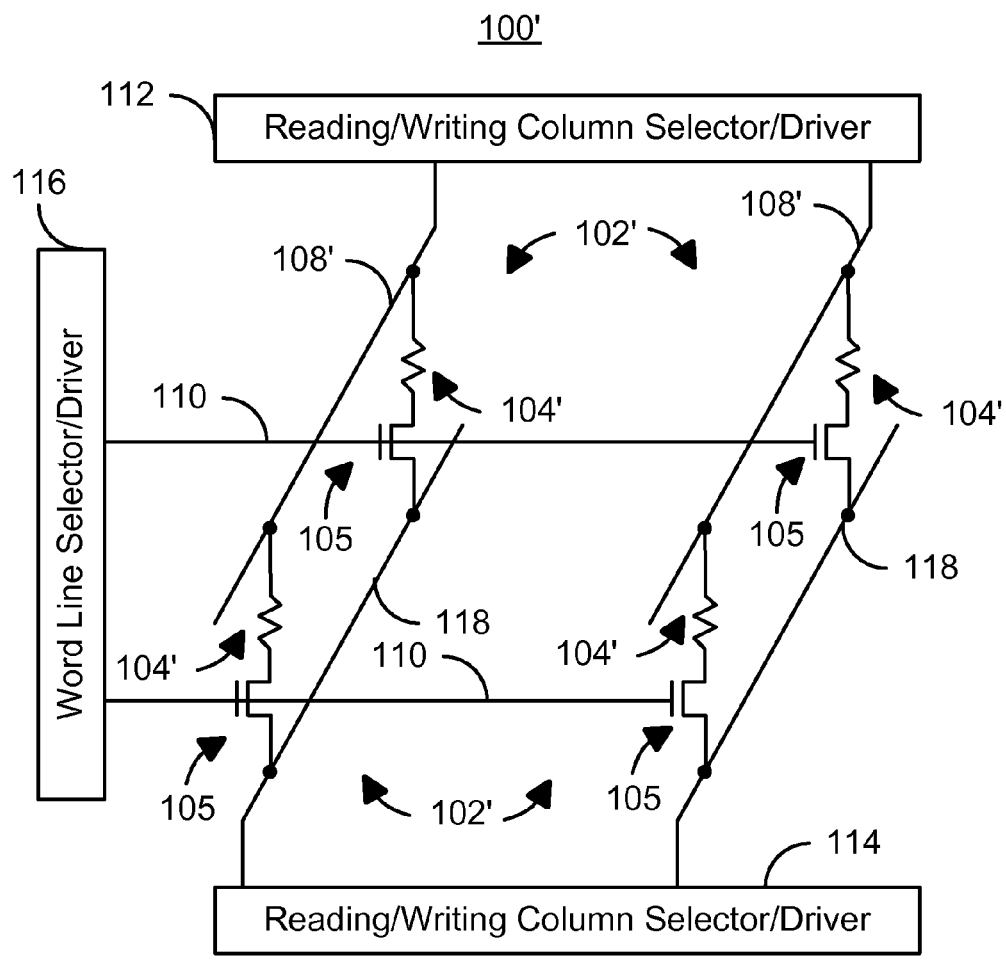
FIG. 4 is a diagram depicting some circuitry for a portion of a field-biased magnetic memory.

To more particularly describe the present invention, refer to FIG. 3 depicting one embodiment of a magnetic memory 100 in accordance with the method and system and including a direct contact. The magnetic memory 100 is preferably an MRAM. The magnetic memory 100 includes cells 102, each of which includes at least a magnetic element 104 that is programmed at least in part by driving a current through the magnetic element 104. The magnetic element 104 also preferably has an easy axis (not shown) corresponding to preferred direction(s) of the magnetization(s) of at least the recording, or free, layer(s) of the magnetic elements 104. The magnetic memory 100 also includes a bit line 108 and bias structure(s) 106. Although only one bit line 108 is shown, one of ordinary skill in the art will readily recognize that the magnetic memory 100 is preferably includes multiple bit lines 108, word lines (not shown), and cells 102 arranged in an array. In addition, although only the magnetic element 104 is shown in each cell 102, a cell 102 preferably includes other components such as a selection transistor (not shown). Furthermore, the magnetic memory 100 preferably includes other components, such as word line(s) (not shown). For example, FIG. 4 depicts an exemplary embodiment of a portion of the circuitry 100' for the magnetic memory 100. FIG. 4 shows the magnetic storage cells 102' including magnetic elements 104' and selection transistors 105. Also shown are bit lines 108', word lines 110, reading/writing column selector/drivers 112 and 114, word line selector/driver 116 and lines 118. In operation, the reading/writing column selector/drivers 112 drive a write or read current through the bit lines 108' and lines 118. The state to which the magnetic element 104' is written depends upon the direction in which the current is driven through the bit lines 108' and lines 118. Not explicitly shown in FIG. 4 are the bias structures 106.

Referring back to FIG. 3, in addition to the bit line 108 and magnetic elements 106, bias structures 106 are shown. Although two bias structures 106 are shown, the magnetic memory 100 may have another number of bias structures 106. For example, a separate bias structure for each storage cell 102 may not be provided. In addition, although the bias structures 106 are depicted as adjacent to the magnetic elements 104, the bias structure 106 are separated from the magnetic elements 104, for example by the bit line 108 or another structure (not shown). The bias structure(s) 106 provide bias(s) field for the magnetic elements 104. The bias structure(s) 106 provide a magnetic bias field in a direction greater than zero degrees and less than one hundred eighty degrees from the easy axis of each magnetic element 104. The precise angle selected may also depend upon the bias field strength and the softness of the materials used. In a preferred embodiment, this direction is substantially ninety degrees from the easy axis.

Use of the bias structures 106 improves performance of the magnetic memory 100 or 100'. In particular, a lower switching current, reduced magnetic coupling between cells, reduced disturbance due to external fields, a more consistent switching with a more predictable switching current, reduced disturbances due to thermal fluctuations, and an improved (narrower) switching current distribution, switching currents that are less subject to shape and other irregularities, and improved thermal stability.

The improvements that may be provided through the bias structures 106 may be understood as follows. The equation for switching time for the magnetic element 104 is analogous to those described above for the magnetic elements 38. The bias structures 106 provide an external field. A sufficient external field modifies the initial conditions for the magnetic element 102 beyond the thermal fluctuation to be:

$$\theta_0 = \sin^{-1} \frac{H_y}{H_K} \quad (2)$$

Using the initial angle form equation (2) and the switching time from equation (1), the external field provided by the bias structure can reduce the switching current and/or switching time. Furthermore, because the initial conditions including $\theta_0$ are more repeatable, the distribution of the switching current and time may be reduced. Consequently, a more consistent switching process than for thermally-created initial conditions may be provided. In addition, the constant biasing field from the bias structures 106 may prevent Oster field caused or the randomly occurring "C" state switching and that reduces the current that is required for the switching of magnetization. Thus, more consistent switching having a smaller distribution of currents and/or times and switching that occurs at a smaller current may be achieved. Note that although the switching current or time can be reduced, in nanosecond regime the reduction may be small because of thermal stability considerations and the precession amplitude being exponentially amplified at a rate given by the balance between the energy loss rate $\alpha \gamma M s$ and the rate at which the energy is supplied by the spin transfer effect. However, the switching current and time distribution may still be reduced. Thus, stated succinctly, the magnetic memory 100 may have a lower switching current, reduce magnetic coupling between the magnetic elements 104 and any external disturbances, more consistent switching with a reduced distribution in switching current, a switching current that is less sensitive to shape irregularities and edge defects, and improved thermal stability.

Figure 5:
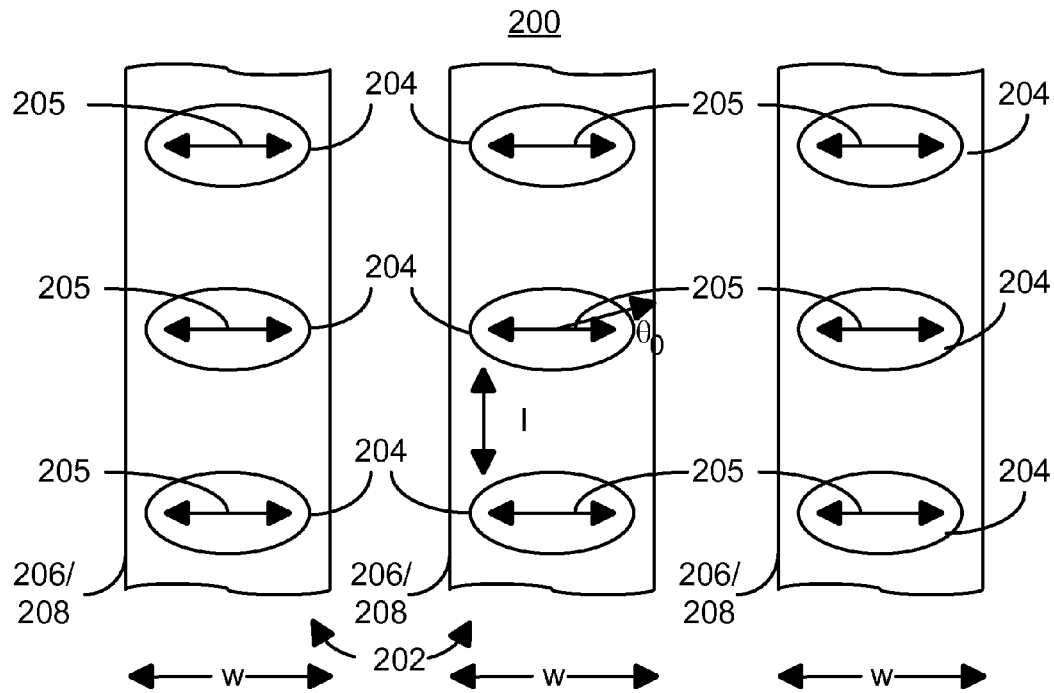
FIG. 5 is a diagram depicting a top view of a second exemplary embodiment of a portion of a field-biased magnetic memory.
Figure 6:
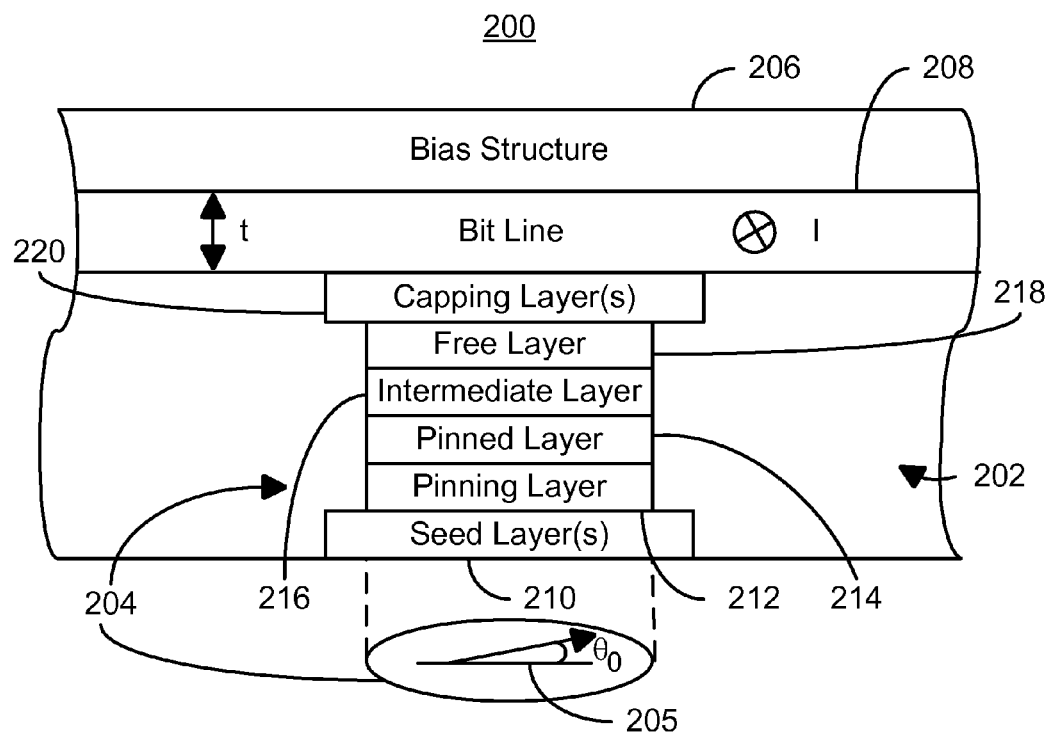
FIG. 6 is a diagram depicting a side view of a second exemplary embodiment of a portion of a field-biased magnetic memory.

FIGS. 5 and 6 are diagrams depicting top and side views, respectively, of a second exemplary embodiment of a portion of a field-biased magnetic memory 200. The magnetic memory 200 may be viewed as a particular implementation of the magnetic memory 100 depicted in FIG. 3. Thus, other components, including but not limited to at least some of the components depicted in FIG. 4, which are not shown are also part of the magnetic memory 200.

Referring back to FIGS. 5-6, the magnetic memory 200 includes cells 202, each of which includes at least a magnetic element 204 that is programmed at least in part by driving a current through the magnetic element 204. The magnetic memory 200 also includes a bit line 208 and bias structure(s) 206. Although only some bit lines 208 are shown, one of ordinary skill in the art will readily recognize that the magnetic memory 200 is preferably includes multiple bit lines 208, word lines (not shown), and cells 202 arranged in an array. In addition, although only the magnetic element 204 is shown in each cell 202, a cell 202 preferably includes other components such as a selection transistor (not shown) may include more than one magnetic element 204. Furthermore, the magnetic memory 200 preferably includes other components, such as word line(s) (not shown), and lines coupled to the magnetic elements 204 such that read and write currents may be driven through the magnetic elements 204.

The magnetic elements 204 depicted are magnetic tunneling junctions. Consequently, the magnetic elements 204 are formed on seed layers 210 and may include a pinning layer 212, a pinned layer 214, an intermediate layer 216 that may be a tunneling barrier layer, a free layer 218 which may also be termed a recording layer, and a capping layer 220. The pinning layer 212 is preferably antiferromagnetic. The magnetization of the free layer 218 may be switched by a current driven through the magnetic element 204. Although magnetic tunneling junctions are depicted, the magnetic elements 204 may be another storage element which is switched by driving a current through the magnetic element 204. Thus, the magnetic elements 204 could include but are not limited to spin valves, dual spin vales, and dual magnetic tunneling junctions. In such embodiments, the intermediate layer 216 may, for example, be conductive.

The magnetic elements 204 have an easy axis 205 in a direction that is substantially perpendicular to the direction in which the bit lines 208 run. For example, as shown in FIG. 5, the easy axis 205 is horizontal, while the bit lines 208 run vertically. The easy axis 205 in this case is formed, at least in part, due to the shape anisotropy of the elliptical magnetic elements 204.

The bit line 208 is preferably adjacent to the bias structure 206. In one embodiment, the bit line 208 and bias structure 206 could be considered to form a single line. However, for the clarity of explanation, the bit line 208 and bias structure 206 will be described as separate structures. The bit line 208 is preferably nonmagnetic and has a high conductivity. Consequently, the bit line 208 may include materials such as Cu, Au, Al, Ag, CuAg, AlCu, Ta, Cr, NiCr, NiFeCr, Ru, Rh and their multilayers and alloys. In addition, the bit line 208 resides between the bias structure 206 and the magnetic elements 204. The bit line 208 is also preferably thin. Consequently, the thickness, t, of the bit line 208 is preferably less than a few hundred nanometers. The width, w, of the bit line 208 is preferably larger than the larger lateral dimensions of the magnetic element 204.

The bias structure 206 preferably resides on and has substantially the same lateral dimensions as the bit line 208. The bias structure 206 is magnetic. In addition, the bias structure 206 has a low coercivity. Thus, the bias structure 206 preferably includes a soft magnetic material having a low coercivity, such as Co, Ni, Fe and their multilayers and alloys. In a preferred embodiment, the bias structure 206 has a coercivity of less than a few hundred Oersted. In another embodiment, the bias structure 206 may have a coercivity as low as less than thirty Oe. The bias structure 206 also preferably has a thickness $t_b$, greater than the thickness of the free layer 218 but less than few hundred nanometers. In one embodiment, the thickness of the bias structure 206 is not more than one hundred nanometers.

Figure 7:
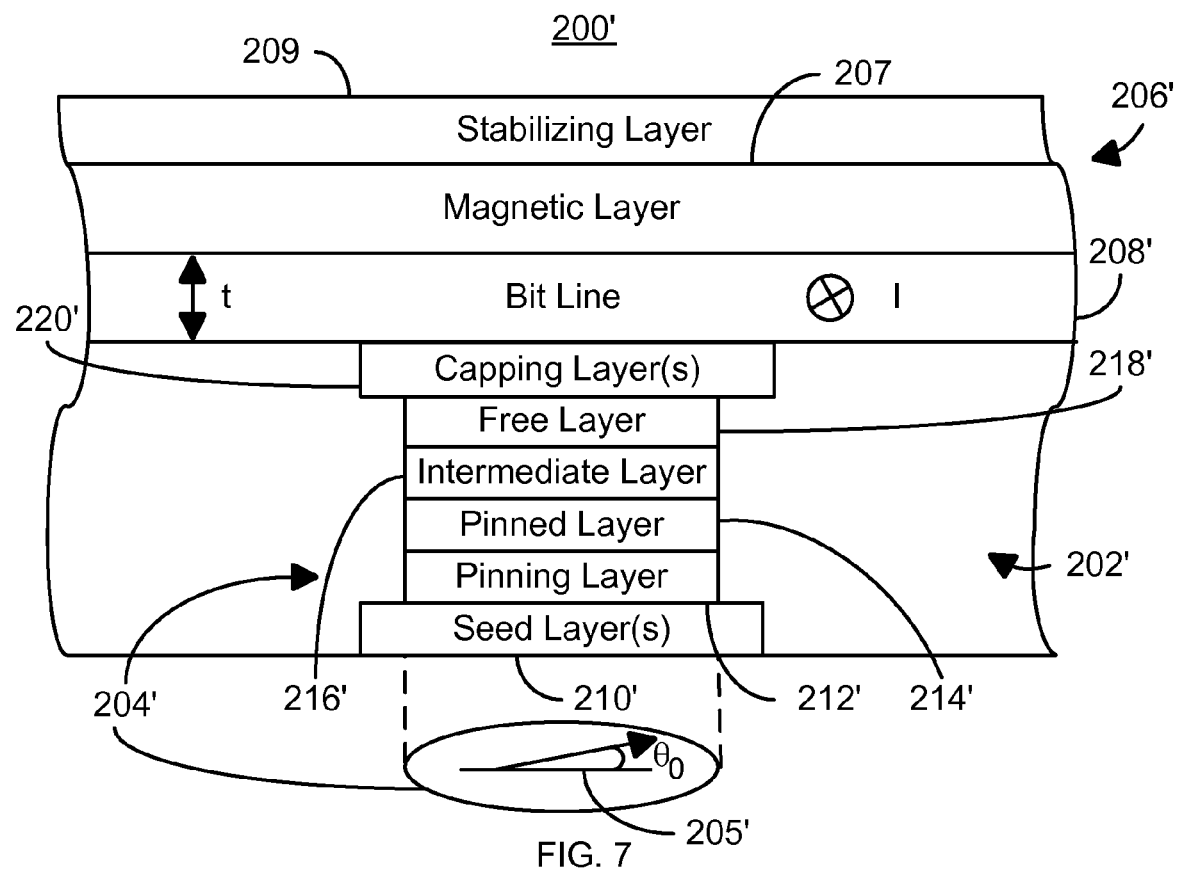
FIG. 7 is a diagram depicting a side view of another version of the second exemplary embodiment of a portion of a field-biased magnetic memory.

FIG. 7 depicts a side view of an alternate version 200' the second exemplary embodiment of the magnetic memory 200. The magnetic memory 200' is analogous to the magnetic memory 200 and thus includes analogous components 202', 206', 208', 210', 212', 214', 216', 218', and 220'. In the magnetic memory 200', the bias structure 206' is a bilayer. A first layer 207 is magnetic. The magnetic layer 207 has a low coercivity material and is preferably analogous to the bias structure 206 described above. The additional layer 209 is a stabilizing layer 209. The magnetic layer 207 preferably resides between the stabilizing layer 209 and the bit line 208'. The stabilizing layer 209 helps to reduce or eliminate magnetic domain structures within the magnetic layer 207. Consequently, and the coupling between the bias structure 206' and the magnetic elements 204' is stabilized. The stabilizing layer 209 may be antiferromagnetic and may include materials such as PtMn, NiMn, IrMn, OsMn, PdPtMn, CrPtMn, NiO, CoO, CoNiO. In such a case, the stabilizing layer 209 is preferably exchange coupled to the magnetic layer 207. The stabilizing layer 209 may also include a permanent magnetic material, such as Co, CoCr, FeCr, CoFeCr, CoCrPt, CoPt, CoCrB, CoPtB, CoP or CoNiFe. In such a case, the stabilizing layer 209 directly couples to the magnetic layer 207.

Referring to FIGS. 5-7, the magnetic memory 200/200' may exhibit improved performance. In particular, a lower switching current, reduced magnetic coupling between cells, reduced disturbance due to external fields, a more consistent switching with a more predictable switching current, reduced disturbances due to thermal fluctuations, and an improved (narrower) switching current distribution, switching currents that are less subject to shape and other irregularities, and improved thermal stability.

These improvements may be explained as follows. The bias structure 206/magnetic layer 207 of the bias structure 206' is magnetostatically coupled to the free layer 218/218'. The magnetization of the bias structure 206/magnetic layer 207 tends to be aligned in the direction of the bit line 208/208' (vertically in FIG. 5). The easy axis of the magnetic element 204/204' is substantially perpendicular to the alignment direction of the bias structure 206/magnetic layer 207. The magnetostatic coupling between the bias structure 206/magnetic layer 207 and the magnetic element 204/204' induces an anisotropy in the magnetic element 204/204'. The magnetization of the bias structure 206/magnetic layer 207 tends to tilt the magnetization of the free layer 218/218' away from the easy axis 205 toward the direction that the bit line 208/208' runs. The initial condition, $\theta_0$, is preferably set by this interaction.

Thus, the switching process for the method and system described herein is believed to be different from thermally activated switching. For thermal activation, thermal fluctuations cause the excursion of the magnetization from the easy axis by an average amount of $\sqrt{k_B T/H_k M_s V}$ (or ~5°) and aid in switching. In contrast, when an external field is applied by the bias structure 206 along the hard axis, the initial condition may mainly be modified by $\sin^{-1}(H_y/H_k)$. Accordingly, the switching current density may be lower than that of thermally activated switching if $\sin^{-1}(H_y/H_k) > \sqrt{k_B T/H_k M_s V}$, with similar $J_c^{P \to AP}$ and $J_c^{AP \to P}$ dependences on the field applied along the hard axis. In such an embodiment, $\theta_0$ may be a few to a few tens of degrees.

Thus, repeatable and desirable initial conditions that facilitate improvement of the performance of the magnetic memory 200/200' are provided. In particular, the constant biasing field from the bias structures 206/206' may prevent Oster field caused or the randomly occurring "C" state switching and that reduces the current that is required for the switching of magnetization. Consequently, more consistent switching having a smaller distribution of currents and/or times and switching that occurs at a smaller current may be achieved.

The magnetostatic coupling that sets the initial conditions as described above may be based on magnetic dipole-dipole interaction and has a strength that is proportional to individual magnetizations of the free layer 204/204' and the bias structure 206/magnetic layer 207, to the thickness (t) of the bias structure 206/magnetic layer 207, and the size of the magnetic element 204/204'. In addition, interactions of this kind generally decay as $1/r^3$, where the r represents of the proximity of the free layer 218/218' and the bias structure 206/magnetic layer 207. The magnetostatic coupling is, therefore, distance sensitive. Consequently tighter process control margins may be desired. Further, this magnetostatic interaction may be modulated and precisely controlled by micro-fabrication process of the magnetic elements 204/204' and the bias structures 206/206'. The biasing field from the bias structure 206/magnetic layer 207 is preferably in the range of tens of Oersteds in the region of the free layer 218/218'. Note that during writing operation the current applied in either direction along the bit line 208/208' (up or down in FIG. 5). The bit line current may rotate the magnetizations of the free layer 218/218' and the bias structure 206/magnetic layer 207 in opposite directions. However, in a preferred embodiment in which the spin transfer effect is utilized in writing, the current is negligible in comparison to field-driven writing (e.g. in the MRAM 10 of FIG. 1). Thus, any disturbances in the magnetization of the bias structure 206/magnetic layer 207 are also preferably negligible. Explained in terms of micromagnetics, the bias structure 206/206' provides an aligning field perpendicular to the easy axis 205 of the free layer 214/214'. This helps prevent the formation of locked states of the magnetization and result in consistent switching process characteristics of a small switch current with significant reduced distribution. Thus, the magnetic memory 200/200' may have a lower switching current, reduced magnetic coupling between the magnetic elements 204/204' and any external disturbances, more consistent switching with a reduced distribution in switching current, a switching current that is less sensitive to shape irregularities and edge defects, and improved thermal stability.

Figure 8:
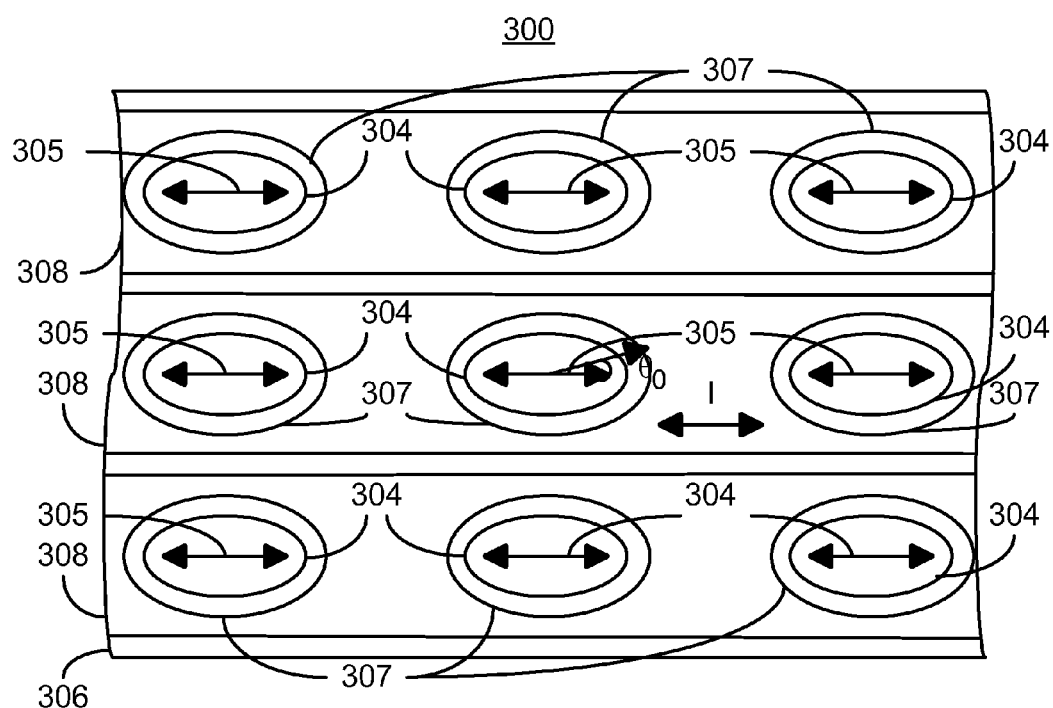
FIG. 8 is a diagram depicting a top view of a third exemplary embodiment of a portion of a field-biased magnetic memory.
Figure 9:
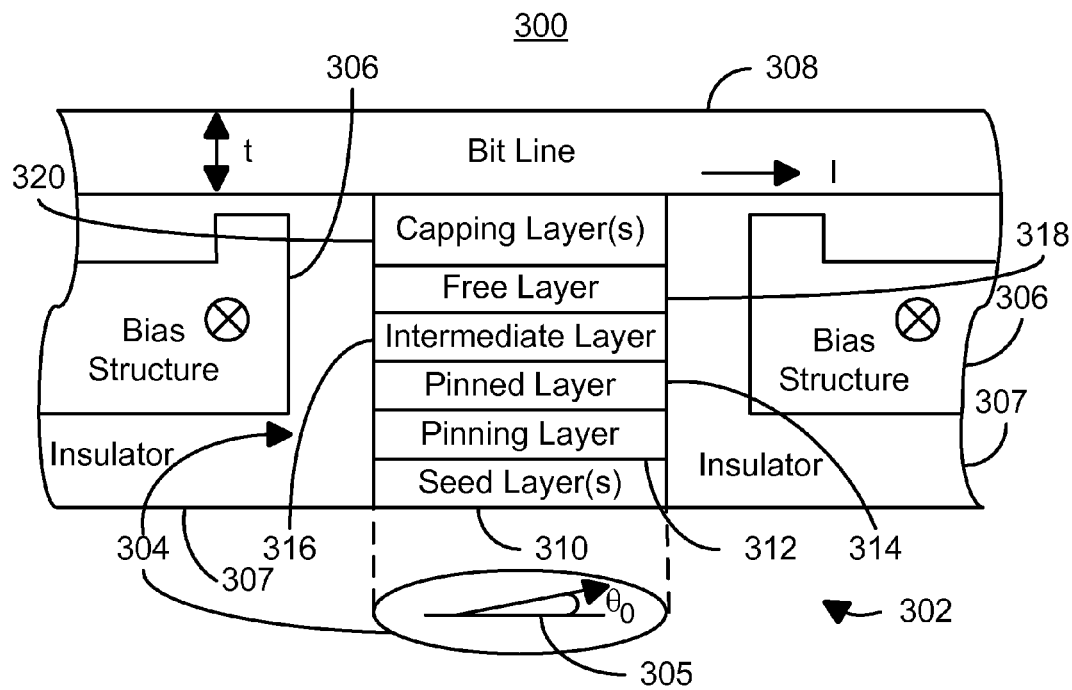
FIG. 9 is a diagram depicting a side view of a third exemplary embodiment of a portion of a field-biased magnetic memory.

FIGS. 8 and 9 are diagrams depicting top and side views, respectively, of a third exemplary embodiment of a portion of a field-biased magnetic memory 300. The magnetic memory 300 may be viewed as a particular embodiment of the magnetic memory 100 depicted in FIG. 3. Thus, other components, including but not limited to at least some of the components depicted in FIG. 4, which are not shown may also be part of the magnetic memory 300.

Referring back to FIGS. 8-9, the magnetic memory 300 includes cells 302, each of which includes at least a magnetic element 304 that is programmed at least in part by driving a current through the magnetic element 304. The magnetic memory 300 also includes a bit line 308 and bias structure(s) 306. Although only some bit lines 308 are shown, one of ordinary skill in the art will readily recognize that the magnetic memory 300 preferably includes multiple bit lines 308, word lines (not shown), and cells 302 arranged in an array. In addition, although only the magnetic element 304 is shown in each cell 302, a cell 302 preferably includes other components such as a selection transistor (not shown) and may include more than one magnetic element 304. Furthermore, the magnetic memory 300 preferably includes other components, such as word line(s) (not shown), and lines coupled to the magnetic elements 304 such that read and write currents may be driven through the magnetic elements 304.

The magnetic elements 304 depicted are magnetic tunneling junctions. Consequently, the magnetic elements 304 are formed on seed layers 310 and may include a pinning layer 312, a pinned layer 314, an intermediate layer 316 that is preferably a tunneling barrier layer, a free layer 318 which may also be termed a recording layer, and a capping layer 320. The pinning layer 312 is preferably antiferromagnetic. The magnetization of the free layer 318 may be switched by a current driven through the magnetic element 304. Although magnetic tunneling junctions are depicted, the magnetic elements 304 may be another storage element which is switched by driving a current through the magnetic element 304. Thus, the magnetic elements 304 could include but are not limited to spin valves, dual spin vales, and dual magnetic tunneling junctions.

The magnetic elements 304 have an easy axis 305 in a direction that is substantially parallel to the direction in which the bit lines 308 run. For example, as shown in FIG. 5, the easy axis 305 and the bit lines 308 run horizontally. The easy axis 305 in this case is formed, at least in part, due to the shape anisotropy of the elliptical magnetic elements 304. The bit line 308 is preferably nonmagnetic and has a high conductivity. Consequently, the bit line 308 may include materials such as Cu, Au, Al, Ag, CuAg, AlCu, Ta, Cr, NiCr, NiFeCr, Ru, Rh and their multilayers and alloys.

The bias structure 306 is a soft magnetic shield layer that resides around at least a portion of the magnetic elements 304. In a preferred embodiment, the bias structure 306 is separated from the magnetic elements 304 by an insulator 307. The bias structure 306 provides a bias field that is substantially perpendicular to the easy axis 305. In a preferred embodiment, the bias field provided by the bias structure 306 is substantially uniformly distributed throughout the array of cells 302. In addition, the vertical alignment of the bias structure 306 and the free layer 318 is important in providing the desired bias field. If the bias structure 306 is below the free layer 318, the bias field may not be uniform across the magnetic memory 300 because of possible variations of the vertical distance from the free layer 318. This issue might be addressed in two manners. First, the thicknesses of both the insulating layer 307 and the bias structure 306 might be increased. The bias field might thus be maintained relatively constant if the proper combination of the thicknesses of insulating layer 307 and the bias structure 306 are selected. Second, the magnetic element 304 may be partially etched when defining the magnetic cell 302. Consequently, the vertical distance from free layer 318 to the bottom base (below the seed layer(s) 310) may be reduced. The bias structure 306 might then be aligned with the free layer 318 with a thinner insulating layer 307. In a preferred embodiment, the top of the bias structure 306 is not planar, but L-shaped. The L-shape of the bias structure 306 may reduce or eliminate the accumulation of magnetic pole/charge at the corner that takes place in planar structures. Such magnetic charges may produce stray magnetic field and disturb the uniform field distribution in the region where the free layer is located. Consequently, in a preferred embodiment, the L-shape of the bias structure 306 is desired.

The magnitude and direction of the bias field from the bias structure 306 may be controlled through processing. In particular, the material(s) and thickness of the bias structure 306 may be utilized to control the bias field. In general, the bias field in the magnetic memory 300 is proportional to the product of the magnetization and the thickness of the bias structure 306. Consequently, the magnetic memory 300 may be preferred over the magnetic memory 200/200' because the bias field does not depend on the geometry and spatial arrangement of the bias structure 306. In a preferred embodiment, a bias field in the range of tens of Oersteds is used.

The bias structure 306 may be formed of the same ferromagnetic material as is used to form the ferromagnetic layers of the magnetic elements 304 or of other soft ferromagnetic material. A CoFe layer at thickness less than few hundred nanometers is preferred, but materials such as NiFe, CoFeNi, CoFeB, CoZrB, CoHfB, FeN may also be appropriate for the bias structure 306. In one embodiment, the thickness of the bias structure 306 is not more than one hundred nanometers. In the process of forming the bias structure 306, the crystalline anisotropy may be controlled and set in various directions relative to the crystalline anisotropy of the free layer 318 by forming the bias structure 306 in the presence of a field of about tens of Oersteds in the desired anisotropy direction. A direction of the bias structure 306 anisotropy that is perpendicular to that of the magnetic element 304 is preferable. Also in a preferred embodiment, a subsequent magnetization of the bias structure 306 is also perpendicular to that of the magnetic element 204. Such orientations may increase and stabilize magnetic coupling between the magnetic elements 304 and the bias structure 306. The process of forming the bias structure 306 may also allow control of the coercivity of the bias structure 306, for example to be in a preferred range of less than few hundred Oersteds.

Figure 10:
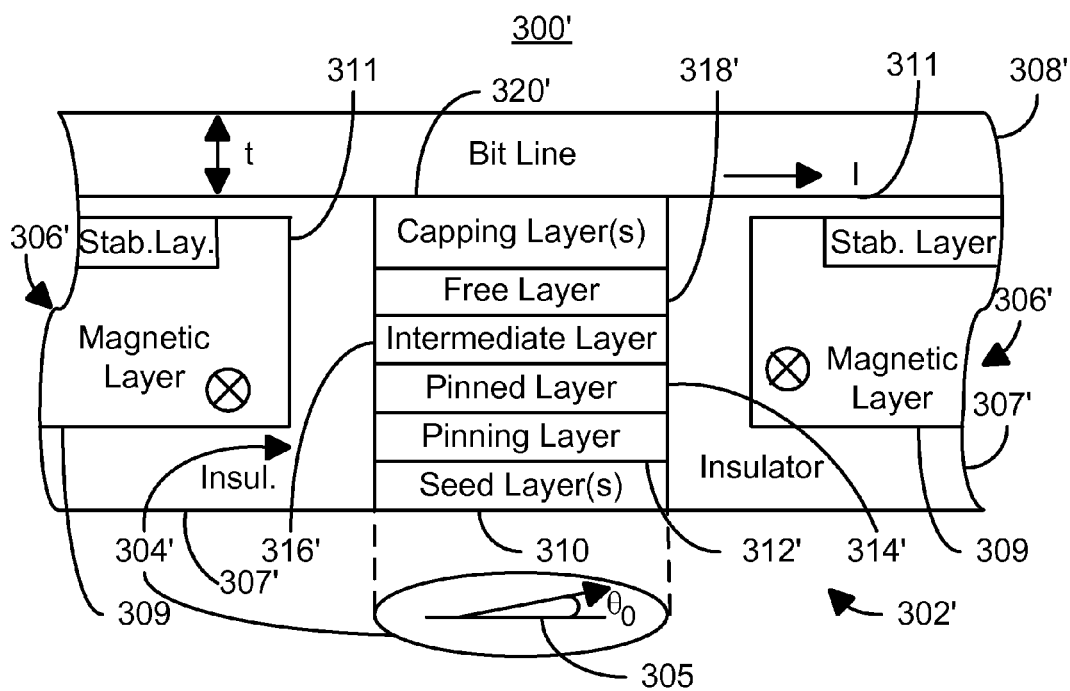
FIG. 10 is a diagram depicting a side view of another version of the third exemplary embodiment of a portion of a field-biased magnetic memory.

FIG. 10 depicts a side view of an alternate version 300' the third exemplary embodiment of the magnetic memory 300. The magnetic memory 300' is analogous to the magnetic memory 300 and thus includes analogous components 302', 304', 306', 308', 310', 312', 314', 316', 318', and 320'. In the magnetic memory 300', the bias structure 306' is a bilayer. A first layer 309 is magnetic. The magnetic layer 309 has a low coercivity material and is preferably analogous to the bias structure 306 described above. In a preferred embodiment, the top of the magnetic layer 306' is not planar, but L-shaped. The L-shape of the magnetic layer 306' may reduce or eliminate the accumulation of magnetic pole/charge at the corner that takes place in planar structures. Such magnetic charges may produce stray magnetic field and disturb the uniform field distribution in the region where the free layer is located. Consequently, in a preferred embodiment, the L-shape of the magnetic layer 306' is desired.

The additional layer 311 is a stabilizing layer. The stabilizing layer 311 helps to reduce or eliminate magnetic domain structures within the magnetic layer 309. Consequently, and the coupling between the bias structure 306' and the magnetic elements 304' is stabilized. The stabilizing layer 311 may be antiferromagnetic and may include materials such as PtMn, NiMn, IrMn, OsMn, PdPtMn, CrPtMn, NiO, CoO, CoNiO. Although depicted as above the magnetic layer 309, in an alternate embodiment, the antiferromagnetic stabilizing layer 311 may reside at another location in the magnetic memory 300'. In such a case, the stabilizing layer 311 is preferably exchange coupled to the magnetic layer 309.

Figure 11:
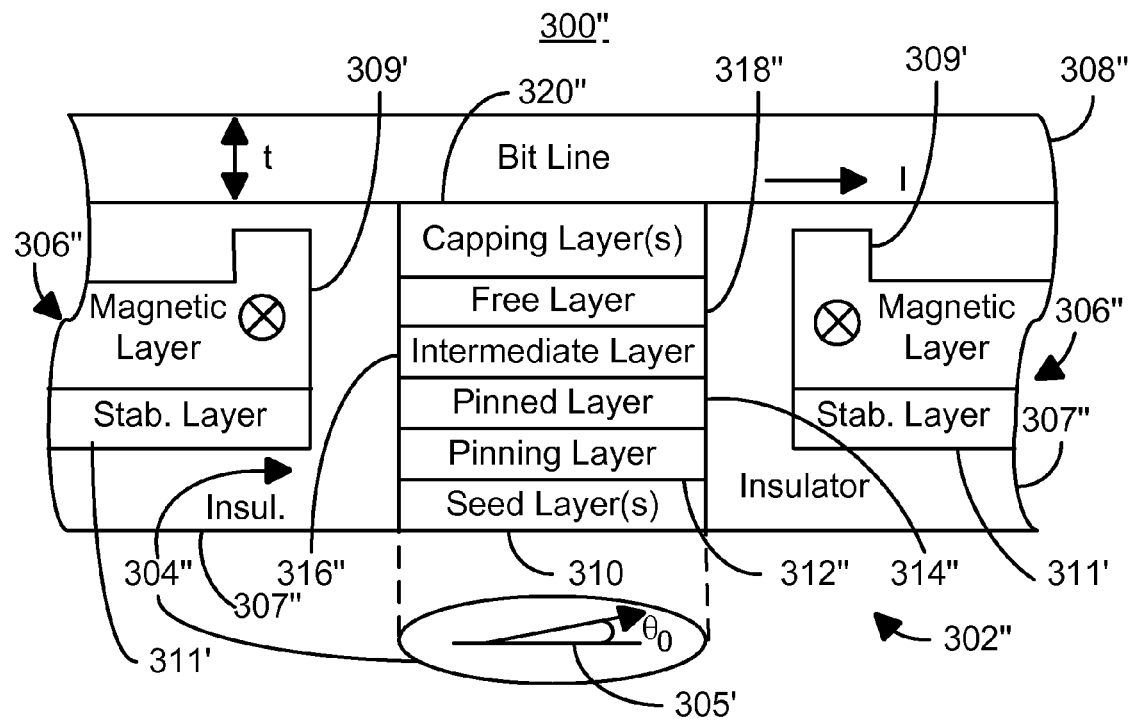
FIG. 11 is a diagram depicting a side view of another version of the third exemplary embodiment of a portion of a field-biased magnetic memory.

FIG. 11 depicts a side view of an alternate version 300" the third exemplary embodiment of the magnetic memory 300. The magnetic memory 300" is analogous to the magnetic memory 300 and thus includes analogous components 302", 304", 306", 308", 310", 312", 314", 316", 318", and 320". In the magnetic memory 300", the bias structure 306" is a bilayer. A first layer 309' is magnetic. The magnetic layer 309' has a low coercivity material and is preferably analogous to the bias structure 306 described above. In a preferred embodiment, the top of the magnetic layer 306" for the reasons discussed above with respect to structures 306 and 306'.

The additional layer 311' is a stabilizing layer. The stabilizing layer 311' helps to reduce or eliminate magnetic domain structures within the magnetic layer 309'. Consequently, and the coupling between the bias structure 306" and the magnetic elements 304" is stabilized. The stabilizing layer 311' may include a permanent magnetic material, such as Co, CoCr, FeCr, CoFeCr, CoCrPt, CoPt, CoCrB, CoPtB, CoP or CoNiFe. In such a case, the stabilizing layer 311' directly couples to the magnetic layer 309'. Although depicted as below the magnetic layer 309', in an alternate embodiment, the antiferromagnetic stabilizing layer 311' may reside at another location in the magnetic memory 300'.

Referring to FIGS. 8-11, the magnetic memory 300/300' may exhibit improved performance. In particular, a lower switching current, reduced magnetic coupling between cells, reduced disturbance due to external fields, a more consistent switching with a more predictable switching current, reduced disturbances due to thermal fluctuations, and an improved (narrower) switching current distribution, switching currents that are less subject to shape and other irregularities, and improved thermal stability.

These improvements may be explained as follows. Uncompensated poles at the edges of the magnetic elements 304 may be magnetostatically coupled to the bias structure 306. Consequently, the formation of randomly oriented edge domains may be reduced. The mutual orthogonality of the magnetizations of the bias structure 306 and the magnetic element 304 may enhance the magnetostatic coupling. As a result, more effective pole compensation may be achieved. The elimination of randomly oriented edge domains allows a uniformity of switching field, Hc, and switching current for the magnetic memory 300. Moreover, to aid in reducing or eliminating undesirable domain structure formations in the magnetic shield itself, an additional formation of antiferromagnetic or permanent magnetic layers formed contiguously or adjacent to, or above, the shield may be provided. These layers may aid in maintaining the shield free of edge domains and stabilizing the shield's magnetization. Explained in terms of micromagnetics, the bias structure 306/306' provides bias, or alignment, field that is substantially perpendicular to the easy axis 305/305' of the free layer 318/318'. This bias field may help prevent the formation of locked states of the magnetization due to Oster field. Thus, more consistent switching, a smaller switching current, and a reduced switching current distribution may be obtained.

Figure 12:
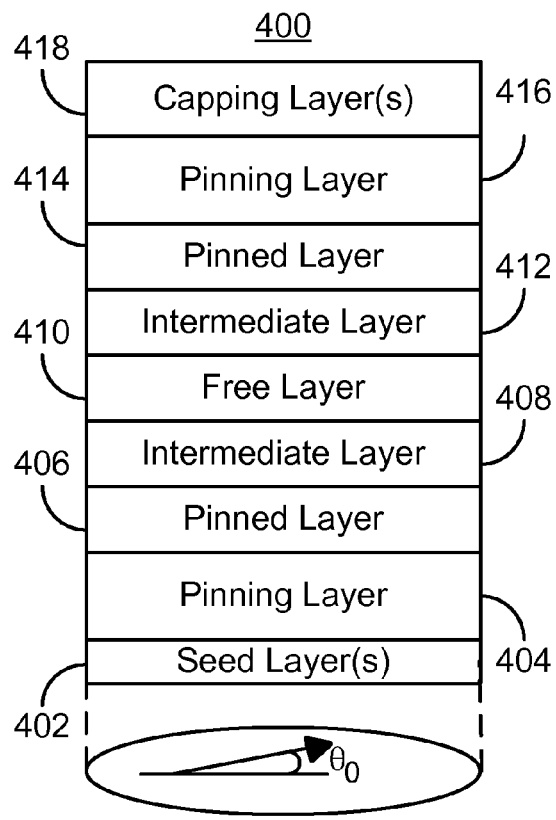
FIGS. 12-14 depict exemplary embodiment of magnetic storage elements usable with the field-biased magnetic memories in accordance with the method and system.
Figure 13:
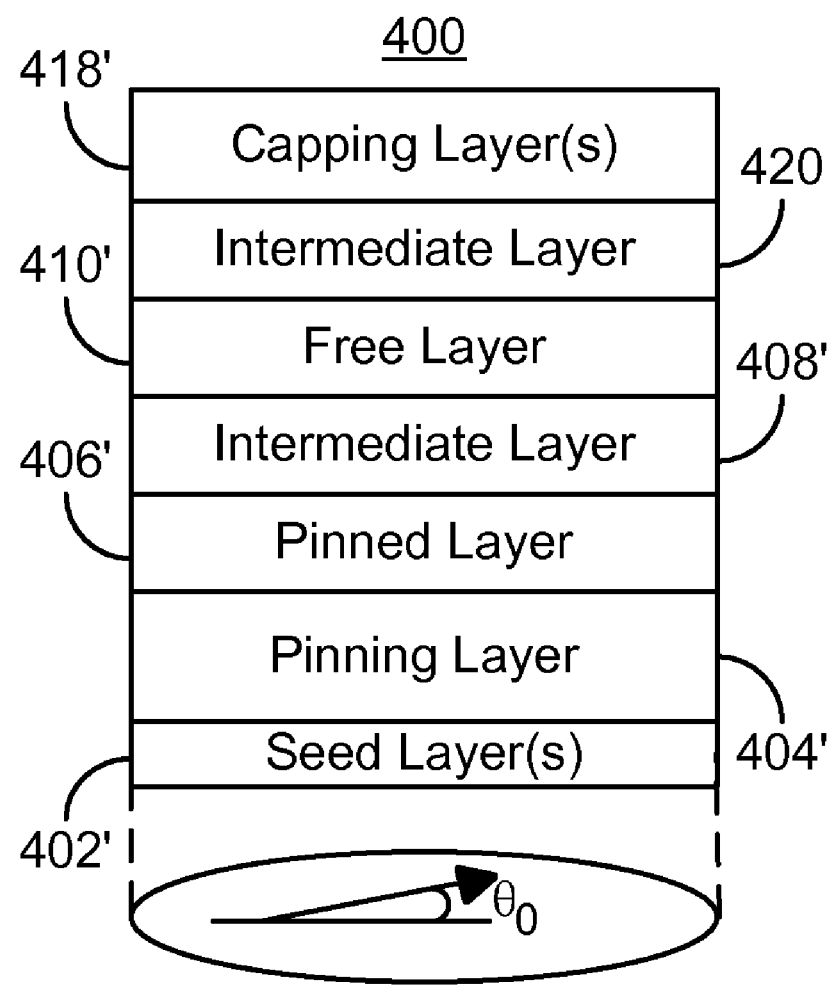
Figure 14:
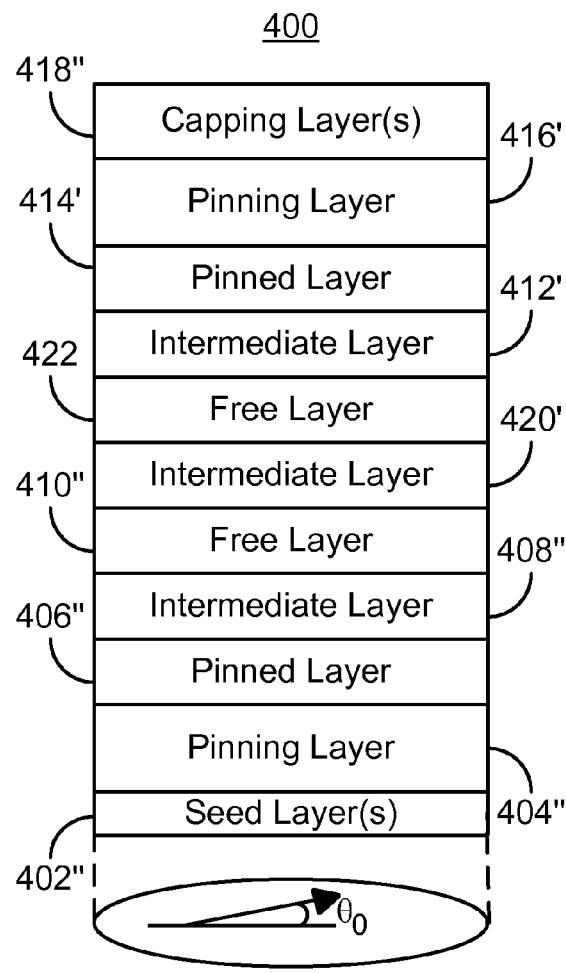

The magnetic memories 100, 200, 200', 300, and 300' are described in the context of magnetic elements 104, 204, 204', 304, and 304', respectively, that are magnetic tunneling junctions. However, as mentioned above, other magnetic elements might be used. FIGS. 12-14 depict exemplary embodiment of magnetic elements that are also usable with the field-biased magnetic memories in accordance with the method and system. FIG. 12 depicts a magnetic element 400 formed on seed layer(s) 402. The magnetic element 400 includes a first pinning layer 404, a first pinned layer 406, a first intermediate layer 408, a free layer 410, a second intermediate layer 412, a second pinned layer 414, a second pinning layer 416 and capping layer(s) 418. The pinning layers 404 and 416 are preferably antiferromagnetic layers. FIG. 13 depicts a magnetic element 400' formed on seed layer(s) 402'. The magnetic element 400' includes a first pinning layer 404', a first pinned layer 406', a first intermediate layer 408', a free layer 410', another intermediate layer 420, and capping layer(s) 418'. The pinning layer 404' is preferably an antiferromagnetic layer. FIG. 14 depicts a magnetic element 400" formed on seed layer(s) 402". The magnetic element 400 includes a first pinning layer 404", a first pinned layer 406", a first intermediate layer 408", a first free layer 410", another intermediate layer 420', a second free layer 422, another intermediate layer 412', a second pinned layer 414', a second pinning layer 416' and capping layer(s) 418". The pinning layers 404" and 416' are preferably antiferromagnetic layers.

For the magnetic elements 104, 204, 204', 304, 304', 400, 400', and 400" particular materials and configurations may be preferred. The free layers 218, 218', 318, 318', 410, 410', 410", and 422 preferably include Co, Fe, Ni or their alloys. The Co, Fe, and/or Ni may have a crystalline structure or may be in amorphous states for example due to modification by boron or other amorphous forming elements addition at different composition, preferably from zero through thirty atomic percent. Examples of such materials include CoFe, NiFe, CoFeNi, CoFeB, CoFeNiB, CoZrB, CoHfB, CoZrTa, CoNbTa and CoHfTa. The saturation magnetization of the free layer 218, 218', 318, 318', 410, 410', 410", and 422 is preferably 400-1500 emu/cm$^3$. Such a saturation magnetization may be achieved by varying the composition of amorphous forming elements.

The free layer 218, 218', 318, 318', 410, 410', 410", and 422 might be a simple, single layer or a multilayer. For a single layer, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers. For example, a synthetic anti-ferromagnetic or magnetostatically free layer having two ferromagnetic layers separated by a nonmagnetic spacer might be used for the free layer 218, 218', 318, 318', 410, 410', 410", and 422. In such a case, the nonmagnetic spacer layer might also provide the advantage of a diffusion stop layer against the possible atom or mass diffusion from intermediate layer or other adjacent layers. The ferromagnetic layers used in the free layer 218, 218', 318, 318', 410, 410', 410", and 422 might include Co, CoFe(5-40%), CoFe(5-40%)B(5-30%) CoFe(5-40%)Ta(5-30%), NiFe(~20%), CoPt(5-40%), CoPd (5-40%), FePt(5-40%), Co$_2$Mn(Al, Si) or Co$_2$(Cr, Fe)(Al, Si). Ferrimagnetic layers used for the free layer 218, 218', 318, 318', 410, 410', 410", and 422 might include CoGd(15-35%) or FeGd(10-40%). The non-magnetic spacer could be Ru, Re or Cu. All compositions are in atomic percent.

The pinned layers 214, 214', 314, 314', 406, 414, 406', 406", and 414' preferably include Co, Fe, Ni or their alloys. The Co, Fe, and/or Ni may have a crystalline structure or may be in amorphous states for example due to modification by boron or other amorphous forming elements addition at different composition, preferably from zero through thirty atomic percent. Examples of such materials include CoFe, NiFe, CoFeNi, CoFeB, CoFeNiB, CoZrB, CoHfB, CoZrTa, CoNbTa and CoHfTa. The pinned layers 214, 214', 314, 314', 406, 414, 406', 406", and 414' might each be a simple, single layer or a multilayer.

For a single layer, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers. For example, a synthetic anti-ferromagnetic or magnetostatically free layer having two ferromagnetic layers separated by a nonmagnetic spacer might be used for the pinned layers 214, 214', 314, 314', 406, 414, 406', 406", and 414'. In such a case, the nonmagnetic spacer layer might also provide the advantage of a diffusion stop layer against the possible atom or mass diffusion from intermediate layer or other adjacent layers. The ferromagnetic layers used in the pinned layers 214, 214', 314, 314', 406, 414, 406', 406", and 414' might include Co, CoFe(5-40%), CoFe(5-40%)B(5-30%) CoFe(5-40%)Ta (5-30%), NiFe(~20%), CoPt(5-40%), CoPd(5-40%), FePt(5-40%), Co$_2$Mn(Al, Si) or Co$_2$(Cr,Fe)(Al, Si). Ferrimagnetic layers used for the pinned layers 214, 214', 314, 314', 406, 414, 406', 406", and 414' might include CoGd(15-35%) or FeGd(10-40%). The non-magnetic spacer could be Ru, Re or Cu. All compositions are in atomic percent.

The intermediate layers 216, 216', 316', 316', 408, 412, 408', 408", and 412' might be either a conductive spacer layer or an insulating barrier layer. There is no requirement that the intermediate layers 408 and 412 or 408" and 412' have the same conductivity. For example, for the intermediate layers 408 and 412, only one of the intermediate layers 408 and 412 might be a conductive spacer layer while the other 412 or 408, respectively is an insulating barrier layer, both the layers 408 and 412 may be conductive or both the layers 408 and 412 may be insulating barrier layers.

If conductive, the intermediate layers 216, 216', 316', 316', 408, 412, 408', 408", and 412' might include Cu, Ag, Pt, Ru, Re, Rh, Ta, Ti, or their combinations or alloys. The non-magnetic spacer layers can also be any above elements with a nanooxide layer or current confinement layer insertion.

If tunneling barrier layers, the intermediate layers 216, 216', 316', 316', 408, 412, 408', 408", and 412' might be a single layer of oxide layer, a nitride oxide layer, an alloy of oxide layer, a nitride of oxide alloy layer, or a multilayer of the above oxides. The intermediate layers 216, 216', 316', 316', 408, 412, 408', 408", and 412' may have a crystalline structure or may be in an amorphous states, depending upon the dielectric constant set and individual layer thickness. The intermediate layers 216, 216', 316', 316', 408, 412, 408', 408", and 412' may have a thickness of greater than zero but not more than fifty Angstroms. The intermediate layers intermediate layers 216, 216', 316', 316', 408, 412, 408', 408", and 412' may be formed by depositing an original metal starting material and then oxidizing the deposited films using natural oxidation and plasma oxidation, or by radio frequency sputtering original oxide starting material so that there is tunneling current across the barrier. The resistance-area product range of the intermediate layers 216, 216', 316', 316', 408, 412, 408', 408", and 412' is preferably at least ten and not more than one hundred Ω-μm². Moreover, the tunneling magneto-resistance values for magnetic elements using the intermediate layers 216, 216', 316', 316', 408, 412, 408', 408", and 412' are preferably greater than twenty percent.

The pinning layers 212, 212', 312, 312', 404, 418, 404', 404", 418' are preferably antiferromagnetic. Also in a preferred embodiment, the antiferromagnetic materials used may include PtMn, NiMn, IrMn, OsMn, PdPtMn, CrPtMn, NiO, CoO, CoNiO. The capping layers 220, 220', 320, 320', 418, 418', and 418" might include Ta, Ti, Al, Mg, Ru, Hf, Zr, Nb, Cu, Cr or their alloys or their multilayer, or their oxides such as AlOx, MgO, TiOx, or their nitride, or oxide-nitride composite. The capping layer 220, 220', 320, 320', 418, 418', and 418" might also be alloying from Ni, Fe, Co, Cr, Ta, Zr, Hf, such as NiCr, NiFeCr, CoZrTa material. The capping layer 220, 220', 320, 320', 418, 418', and 418" may also be any combination of different groups described above.

In the magnetic memories 100/200/200'/300/300' the provided bias field from the bias structure 106/206/206'/306/306' might, to some extent, reduce the thermal stability of the magnetic MTJ cell. For a bias field, $H_y$, the following relationship holds.

$$\Delta(H_y) = \frac{M_S H_K V}{2k_B T}\left(1 - \frac{H_y}{H_K}\right)^2 \quad (3)$$

Thus, the thermal stability decays by amount of $(1-H_y/H_k)^2$ with the applied bias field. However, the thermal stability loss is preferably comparatively small because $H_y$ is much less than $H_k$. If a large $H_y$ does occur, the thermal stability loss may be compensated by free layer engineering, for example using high $H_k$ material/permanent magnetic layer or top pinning for the free layer 218/218'/318/318'/410/410'/422 by an antiferromagnetic material such as for the intermediate layer 420/420'. The intermediate layer 420/420' might be an antiferromagnetic material, such as PtMn, NiMn, IrMn, OsMn, PdPtMn, CrPtMn, NiO, CoO, CoNiO which exchange couples to the ferromagnetic portion of the free layer 218/218'/318/318'/410/410'/422, a permanent magnetic material, such as Co, CoCr, FeCr, CoFeCr, CoCrPt, CoPt, CoCrB, CoPtB, CoP or CoNiFe, which directly couples to the ferromagnetic free layer 218/218'/318/318'/410/410'/422. Either material can be used to enhance the $H_k$. Consequently, thermal stability is preferably substantially preserved.

Figure 15:
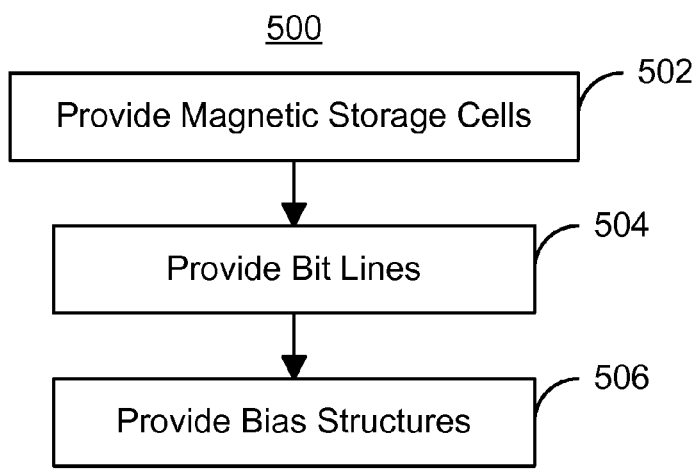
FIG. 15 is a flow chart depicting one embodiment of a method for providing a field-biased magnetic memory in accordance with the method and system.

FIG. 15 is a flow chart depicting one embodiment of a method 500 for providing a field-biased magnetic memory 100, 200, 200', 300, and/or 300' in accordance with the method and system. A plurality of magnetic storage cells 102, 202, 202', 302, and/or 302' are provided, via step 502. For the magnetic memories 200/200', step 502 includes providing a bottom electrode as well as fabricating and insulating the magnetic elements 204/204'.

A plurality of bit lines 108, 208, 208', 308, and/or 308' corresponding to the plurality of magnetic storage cells are provided, via step 504. For the memories 200/200'/300/300', step 504 may include exposing the magnetic element 204/204'/304/304', for example by a chemical mechanical planarization process, such that electric contact can be made to the magnetic elements 200/200'. Step 504 may also include depositing the material for the bit lines 108, 208, 208', 308, and/or 308'. However, for the memory 300, step 504 is performed after most of step 506.

At least one bias structure magnetically coupled with the at least one magnetic element in each of the plurality of magnetic storage cells is provided, via step 506. The bias structure(s) are configured to provide a bias field in a direction greater than zero degrees and less than one hundred eighty degrees from the easy axis. For the magnetic memory 200/200' the bias structure 206/206' is deposited on the bit line 208/208', respectively. The bit line 208/208' and bias structure 206/206' are also preferably defined together, for example in step 506. In addition, the direction of magnetization for the bias structure 206/206' may also be set. For the magnetic memory 300/300', step 506 is commenced prior to step 504. The insulating layer 307/307' and bias structure 306/306' are deposited. The bottom electrode and the bias structure 306/306' are preferably formed in the same etching process. In such an embodiment, step 506 may also include depositing thick insulation layer prior to formation of the bit lines 308 and 308'.

After thermal processing is substantially completed, the bias structure 206/206'/306/306' is cycled through a magnetic initialization process to reset the field direction. The purpose of this process is to refresh the magnetization alignment of the bias structure 206/206'/306/306' in the event that it was disturbed in the previous processes. Afterward the alignment of the magnetization or field should be more consistent and uniform across the wafer. Typically this can be performed with an alignment field larger than the coercivity field of the magnetic bias layer, in less than one minute, for instance. Thus, using the method 500, the magnetic memories 100, 200, 200', 300, and 300' having improved performance may be achieved.

A method and system for providing field biased magnetic memory has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
    a plurality of magnetic storage cells in an array, each of the plurality of magnetic storage cells including at least one magnetic element having at least one magnetization, the at least one magnetic element having an easy axis and being programmable by at least one write current driven through the magnetic element;
    a plurality of bit lines corresponding to the plurality of magnetic storage cells; and
    at least one bias structure, each of the at least one bias structure adjoining and magnetically coupled with the at least one magnetic element in each of a portion of the plurality of magnetic storage cells, the portion of the plurality of magnetic storage cells including multiple magnetic storage cells, the at least one bias structure providing a bias field configured to bias the at least one magnetization of the at least one magnetic element in a direction greater than zero degrees and less than one hundred eighty degrees from the easy axis;
    wherein the bias structure further includes: at least one magnetically soft layer magnetostatically coupled to the at least one magnetic element; and
    wherein the at least one magnetically soft layer is adjacent to each of the plurality of bit lines.

2. The magnetic memory of claim 1 wherein the angle is at least eighty degrees and not more than one hundred degrees.

3. The magnetic memory of claim 2 wherein the angle is substantially ninety degrees.

4. A magnetic memory comprising:
a plurality of magnetic storage cells in an array, each of the plurality of magnetic storage cells including at least one magnetic element having at least one magnetization, the at least one magnetic element having an easy axis and being programmable by at least one write current driven through the magnetic element;
a plurality of bit lines corresponding to the plurality of magnetic storage cells; and
at least one bias structure, each of the at least one bias structure magnetically coupled with the at least one magnetic element in each of a portion of the plurality of magnetic storage cells, the portion of the plurality of magnetic storage cells including multiple magnetic storage cells, the at least one bias structure providing a bias field configured to bias the at least one magnetization of the at least one magnetic element in a direction greater than zero degrees and less than one hundred eighty degrees from the easy axis:
wherein the plurality of bit lines resides between the at least one magnetic element and the at least one bias structure.

5. The magnetic memory of claim 1 wherein each of the plurality of bit lines includes at least one of Cu, Au, Al, Ag, CuAg, AlCu, Ta, Cr, NiCr, NiFeCr, Ru, and Rh.

6. The magnetic memory of claim 1 wherein the magnetically soft layer includes at least one of Co, Ni, and Fe and has a coercivity of not more than one hundred Oersteds.

7. The magnetic memory of claim 1 wherein the magnetically soft layer includes a material, the at least one magnetic element includes at least one free layer having the at least one magnetization, and the at least one free layer also including the material.

8. The magnetic memory of claim 7 wherein the at least one magnetic element includes at least one free layer having a free layer thickness and the at least one magnetization, the magnetically soft layer having a thickness greater than the free layer thickness.

9. The magnetic memory of claim 8 wherein the thickness of the magnetically soft layer is not more than few hundred nanometers.

10. The magnetic memory of claim 1 wherein each of the plurality of bit lines have a bit line direction.

11. The magnetic memory of claim 10 wherein the easy axis is substantially perpendicular to the bit line direction.

12. The magnetic memory of claim 1 wherein the bias structure further includes a stabilizing structure coupled with the magnetically soft layer.

13. The magnetic memory of claim 12 wherein the stabilizing structure further includes an antiferromagnetic material adjacent to the magnetically soft layer.

14. The magnetic memory of claim 13 wherein the antiferromagnetic material includes at least one of PtMn, NiMn, IrMn, OsMn, PdPtMn, CrPtMn, NiO, CoO, and CoNiO.

15. The magnetic memory of claim 12 wherein the stabilizing structure further includes a permanent magnetic material.

16. The magnetic memory of claim 14 wherein the permanent magnetic material includes at least one of Co, CoCr, FeCr, CoFeCr, CoCrPt, CoPt, CoCrB, CoPtB, CoP and CoNiFe.

17. A magnetic memory comprising:
a plurality of magnetic storage cells in an array, each of the plurality of magnetic storage cells including at least one magnetic element having at least one magnetization, the at least one magnetic element having an easy axis and being programmable by at least one write current driven through the magnetic element;
a plurality of bit lines corresponding to the plurality of magnetic storage cells; and
at least one bias structure, each of the at least one bias structure magnetically coupled with the at least one magnetic element in each of a portion of the plurality of magnetic storage cells, the portion of the plurality of magnetic storage cells including multiple magnetic storage cells, the at least one bias structure providing a bias field configured to bias the at least one magnetization of the at least one magnetic element in a direction greater than zero degrees and less than one hundred eighty degrees from the easy axis;
wherein the at least one bias structure further includes a magnetic shield substantially surrounding a portion of the at least one magnetic element, the magnetic shield being magnetically soft and having an L-shared top portion.

18. The magnetic memory of claim 17 wherein the bias structure further includes an insulator residing between the portion of the at least one magnetic element and the magnetic shield.

19. The magnetic memory of claim 18 wherein the at least one magnetic element includes at least one free layer having the at least one magnetization, the portion of the at least one magnetic element including the at least one free layer.

20. The magnetic memory of claim 18 wherein the magnetic shield includes a material, the at least one magnetic element includes at least one free layer, the free layer also including the material.

21. The magnetic memory of claim 18 wherein the magnetic shield further includes at least one of CoFe, NiFe, CoFeNi, CoFeB, CoZrB, CoHfB, and FeN.

22. The magnetic memory of claim 18 wherein the bias structure further includes a stabilizing structure coupled with the magnetic shield.

23. The magnetic memory of claim 22 wherein the stabilizing structure further includes an antiferromagnetic material adjacent to the magnetic shield.

24. The magnetic memory of claim 23 wherein the antiferromagnetic material includes at least one of PtMn, NiMn, IrMn, OsMn, PdPtMn, CrPtMn, NiO, CoO, and CoNiO.

25. The magnetic memory of claim 22 wherein the stabilizing structure further includes a permanent magnetic material.

26. The magnetic memory of claim 25 wherein the permanent magnetic material includes at least one of Co, CoCr, FeCr, CoFeCr, CoCrPt, CoPt, CoCrB, CoPtB, CoP and CoNiFe.

27. The magnetic memory of claim 18 wherein each of the plurality of bit lines have a bit line direction.

28. The magnetic memory of claim 27 wherein the easy axis is substantially parallel to the bit line direction.

29. The magnetic memory of claim 27 further comprising:
a plurality of lines coupled with the magnetic storage cells, the plurality of lines and the plurality of bit lines being configured to drive at least one write current and at least one read current through the at least one magnetic element.

30. A method for providing a magnetic memory comprising:
providing a plurality of magnetic storage cells in an array, each of the plurality of magnetic storage cells including at least one magnetic element, the at least one magnetic element having an easy axis and at least one magnetization and being programmable by at least one write current driven through the magnetic element;

providing a plurality of bit lines corresponding to the plurality of magnetic storage cells; and providing at least one bias structure, each of the at least one bias structure magnetically coupled with the at least one magnetic element in each of a portion of the plurality of magnetic storage cells, the portion of the plurality of magnetic storage cells including multiple magnetic storage cells, the at least one bias structure providing a bias field configured to bias the at least one magnetization of the at least one magnetic element in a direction greater than zero degrees and less than one hundred eighty degrees from the easy axis wherein the step of providing the at least one bias structure further includes at least one of providing the at least one bias structure adjoining the at least one magnetic element, providing the at least one bias structure such that the plurality of bit lines resides between the at least one bias structure and the at least one magnetic element, and providing a magnetic shield substantially surrounding a portion of the at least one magnetic element, the magnetic shield having an L-shared top portion.

* * * * *